United States Patent
Corrales et al.

(10) Patent No.: US 8,410,350 B2
(45) Date of Patent: *Apr. 2, 2013

(54) MODULAR SOLAR PANELS WITH HEAT EXCHANGE

(75) Inventors: Eugenia Corrales, Los Altos, CA (US); Mark Brillhart, Palo Alto, CA (US); Ana M. Corrales, Los Altos, CA (US)

(73) Assignee: NS Acquisition LLC, Sacramento, CA (US)

( * ) Notice: Subject to any disclaimer, the term of this patent is extended or adjusted under 35 U.S.C. 154(b) by 804 days.

This patent is subject to a terminal disclaimer.

(21) Appl. No.: 11/788,456

(22) Filed: Apr. 19, 2007

(65) Prior Publication Data

US 2008/0135085 A1    Jun. 12, 2008

Related U.S. Application Data (60) Provisional application No. 60/874,313, filed on Dec. 11, 2006.

(51) Int. Cl.
*H02N 6/00* (2006.01)
*H01L 31/042* (2006.01)
(52) U.S. Cl. .................. 136/246; 136/244; 136/251
(58) Field of Classification Search .............. 136/243, 136/246, 259, 244, 251
See application file for complete search history.

(56) References Cited

U.S. PATENT DOCUMENTS

| | | | |
|---|---|---|---|
| 2,989,575 A | 6/1961 | Wallace, Jr. | |
| 3,268,366 A | 8/1966 | Guyot | |
| 3,833,425 A | 9/1974 | Leinkram et al. | |
| 3,976,508 A | 8/1976 | Mlavsky | |
| 3,985,116 A | 10/1976 | Kapany | |
| 3,999,283 A * | 12/1976 | Dean et al. | 438/65 |
| 4,026,267 A | 5/1977 | Coleman | |
| 4,040,867 A | 8/1977 | Forestieri et al. | |
| 4,056,405 A | 11/1977 | Varadi | |
| 4,062,698 A | 12/1977 | Blakeslee et al. | |
| 4,095,997 A | 6/1978 | Griffiths | |
| 4,106,952 A | 8/1978 | Kravitz | |
| 4,118,249 A | 10/1978 | Graven et al. | |
| 4,131,485 A | 12/1978 | Meinel et al. | |

(Continued)

FOREIGN PATENT DOCUMENTS

| | | |
|---|---|---|
| EP | 0654819 A3 | 11/1994 |
| EP | 0877427 | 11/1998 |

(Continued)

OTHER PUBLICATIONS

Chokeman, Yutasak and Somchai Wongwises. "Effects of fin pattern on the air-side performance of herringbone wavy fin-and-tube heat exchangers". Heat Mass Transfer (2005) 41: 642-650.*

(Continued)

*Primary Examiner* — Jonathan Johnson
*Assistant Examiner* — Lindsey Bernier
(74) *Attorney, Agent, or Firm* — The Mueller Law Office, P.C.

(57) ABSTRACT

A photovoltaic module with photovoltaic cell and a heat sink. The heat sink is attached on a side of the cell opposite to the light-receiving side of the photovoltaic cell. The heat sink can remove heat caused by light absorbed by the photovoltaic cell but not converted to electricity as well as heat generated by resistance to high current passing through electrodes of the photovoltaic cell. A photovoltaic module formed of such cells can exhibit greater energy conversion efficiency as a result of the ability to dissipate the heat. A method of making a solar module involves e.g. laminating a heat sink to a photovoltaic cell.

10 Claims, 9 Drawing Sheets

U.S. PATENT DOCUMENTS

| | | | | |
|---|---|---|---|---|
| 4,149,903 | A | 4/1979 | Lindmayer | |
| 4,180,414 | A | 12/1979 | Diamond et al. | |
| 4,193,081 | A | 3/1980 | Kaplow et al. | |
| 4,200,472 | A | 4/1980 | Chappell et al. | |
| 4,209,347 | A | 6/1980 | Klein | |
| 4,296,741 | A * | 10/1981 | Harder | 126/658 |
| 4,326,012 | A | 4/1982 | Charlton | |
| 4,336,413 | A | 6/1982 | Tourneux | |
| 4,352,948 | A | 10/1982 | Kaplow et al. | |
| 4,361,717 | A | 11/1982 | Gilmore et al. | |
| 4,389,533 | A | 6/1983 | Ames | |
| 4,392,007 | A | 7/1983 | Barkats et al. | |
| 4,571,448 | A * | 2/1986 | Barnett | 136/259 |
| 4,582,953 | A | 4/1986 | Nagase et al. | |
| 4,595,789 | A | 6/1986 | Nagase et al. | |
| 4,710,588 | A | 12/1987 | Ellion | |
| 4,830,678 | A | 5/1989 | Todorof et al. | |
| 5,008,062 | A | 4/1991 | Anderson et al. | |
| 5,118,361 | A | 6/1992 | Fraas et al. | |
| 5,125,983 | A | 6/1992 | Cummings | |
| 5,232,518 | A | 8/1993 | Nath et al. | |
| 5,255,666 | A | 10/1993 | Curchod | |
| 5,338,369 | A | 8/1994 | Rawlings | |
| 5,437,735 | A | 8/1995 | Younan et al. | |
| 5,498,297 | A | 3/1996 | O'Neill et al. | |
| 5,575,861 | A | 11/1996 | Younan et al. | |
| 5,702,558 | A | 12/1997 | Schadel | |
| 5,743,970 | A | 4/1998 | Czubatjy et al. | |
| 5,746,839 | A | 5/1998 | Dinwoodie | |
| 5,951,785 | A | 9/1999 | Uchihashi et al. | |
| 5,968,287 | A | 10/1999 | Nath | |
| 5,986,203 | A | 11/1999 | Hanoka et al. | |
| 6,005,184 | A | 12/1999 | Barnes | |
| 6,020,554 | A | 2/2000 | Kaminar et al. | |
| 6,051,774 | A | 4/2000 | Yoshida et al. | |
| 6,201,180 | B1 | 3/2001 | Meyer et al. | |
| 6,248,949 | B1 | 6/2001 | Turner | |
| 6,274,402 | B1 | 8/2001 | Verlinden et al. | |
| 6,294,725 | B1 | 9/2001 | Hirschberg et al. | |
| 6,337,283 | B1 | 1/2002 | Verlinden et al. | |
| 6,359,209 | B1 | 3/2002 | Glenn et al. | |
| 6,387,726 | B1 | 5/2002 | Verlinden et al. | |
| 6,399,874 | B1 | 6/2002 | Olah | |
| 6,423,568 | B1 | 7/2002 | Verlinden et al. | |
| 6,531,653 | B1 | 3/2003 | Glenn et al. | |
| 6,553,729 | B1 | 4/2003 | Nath et al. | |
| 6,875,914 | B2 | 4/2005 | Guha et al. | |
| RE38,988 | E | 2/2006 | Dinwoodie | |
| 7,019,971 | B2 | 3/2006 | Houle et al. | |
| 7,076,965 | B2 | 7/2006 | Lasich et al. | |
| 7,135,350 | B1 | 11/2006 | Smith et al. | |
| 2004/0103680 | A1 | 6/2004 | Lasich | |
| 2004/0187909 | A1 | 9/2004 | Sato et al. | |
| 2004/0221886 | A1 | 11/2004 | Oono | |
| 2005/0022857 | A1 | 2/2005 | Daroczi et al. | |
| 2005/0022861 | A1 | 2/2005 | Rose et al. | |
| 2005/0061360 | A1 | 3/2005 | Horioka et al. | |
| 2005/0068725 | A1 | 3/2005 | Houle et al. | |
| 2005/0076948 | A1 | 4/2005 | Komamine | |
| 2005/0077615 | A1* | 4/2005 | Yu et al. | 257/706 |
| 2005/0081909 | A1* | 4/2005 | Paull | 136/246 |
| 2006/0032527 | A1 | 2/2006 | Stevens et al. | |
| 2006/0042682 | A1 | 3/2006 | Wolfe et al. | |
| 2006/0042683 | A1 | 3/2006 | Gangemi | |
| 2006/0137733 | A1 | 6/2006 | Schripsema et al. | |
| 2006/0196535 | A1 | 9/2006 | Swanson et al. | |
| 2007/0074755 | A1 | 4/2007 | Eberspacher et al. | |
| 2007/0199590 | A1 | 8/2007 | Tanaka et al. | |
| 2008/0006320 | A1 | 1/2008 | Magnussen Aas et al. | |
| 2008/0023061 | A1 | 1/2008 | Clemens et al. | |
| 2008/0134497 | A1 | 6/2008 | Corrales | |
| 2008/0135086 | A1 | 6/2008 | Corrales | |
| 2008/0135088 | A1 | 6/2008 | Corrales | |
| 2008/0135090 | A1 | 6/2008 | Corrales | |
| 2008/0135092 | A1* | 6/2008 | Corrales | 136/256 |
| 2008/0135094 | A1 | 6/2008 | Corrales | |
| 2008/0302030 | A1 | 12/2008 | Stancel et al. | |

FOREIGN PATENT DOCUMENTS

| | | | | |
|---|---|---|---|---|
| JP | 03025146 | A | | 2/1991 |
| JP | 09279789 | A | * | 10/1997 |
| JP | 11036540 | A | * | 2/1999 |
| WO | WO-79/00140 | A1 | | 3/1979 |
| WO | WO-93/14525 | A1 | | 7/1993 |
| WO | WO-00/05769 | A1 | | 2/2000 |
| WO | WO-00/30184 | A1 | | 5/2000 |
| WO | WO-00/57486 | A1 | | 9/2000 |
| WO | WO-02/056389 | A1 | | 7/2002 |
| WO | WO-03/098705 | A1 | | 11/2003 |
| WO | WO-2005/045328 | A1 | | 5/2005 |
| WO | WO-2005/100715 | A1 | | 10/2005 |

OTHER PUBLICATIONS

English machine translation of JP 11036540A.*
English machine translation of JP 09-279789 A.*
U.S. Appl. No. 11/788,573, filed Apr. 20, 2007, by Corrales et al.
U.S. Appl. No. 11/788,703, filed Apr. 19, 2007, by Corrales et al.
U.S. Appl. No. 11/804,399, filed May 18, 2007, by Corrales et al.
U.S. Appl. No. 11/804,656, filed May 18, 2007, by Corrales et al.
U.S. Appl. No. 11/804,657, filed May 18, 2007, by Corrales et al.
U.S. Appl. No. 11/804,695, filed May 18, 2007, by Corrales et al.
Non-Final Office Action mailed on Jul. 23, 2009, for U.S. Appl. No. 11/804,657, filed May 18, 2007, 15 pages.
Non-Final Office Action mailed on Aug. 5, 2009, for U.S. Appl. No. 11/788,703, filed Apr. 19, 2007, 11 pages.
Non-Final Office Action mailed on Aug. 5, 2009, for U.S. Appl. No. 11/804,399, filed May 18, 2007, 10 pages.
Office Action dated Feb. 17, 2011 for U.S. Appl. No. 11/804,695.
Chokeman et al. "Effect of fin pattern on the air-side performance of herringbone wavy fin-and-tube heat exchangers", Heat Mass Transfer (2005) 41: 642-650.
Office Action mailed on Dec. 9, 2009 for U.S. Appl. No. 11/804,656.
Office Action mailed on Mar. 5, 2010 for U.S. Appl. No. 11/804,657.
Office Action mailed on Mar. 26, 2010 for U.S. Appl. No. 11/804,695.
International Search Report mailed on Apr. 4, 2010 for International Application No. PCT/US2007/087007.
The International Search Report and Written Opinion of the International Searching Authority, Application No. PCT/US2007/087010, mailed Jun. 14, 2010.
Final Office Action mailed on Oct. 15, 2010 for U.S. Appl. No. 11/804,695.
Office Action dated Aug. 30, 2011 for U.S. Appl. No. 11/804,695.
Office Action dated Nov. 10, 2011 for U.S. Appl. No. 11/804,657.
Office Action dated Jun. 20, 2012 for U.S. Appl. No. 11/804,657.

* cited by examiner

MODULAR SOLAR PANELS WITH HEAT EXCHANGE

CROSS REFERENCE TO RELATED APPLICATIONS

This application claims priority benefit of U.S. Provisional Application No. 60/874,313, entitled "Modular Solar Roof Tiles and Solar Panels With Heat Exchange" filed Dec. 11, 2006, which is incorporated by reference in its entirety herein as if it was put forth in full below.

BACKGROUND OF THE INVENTION

Solar energy is a renewable energy source that has gained significant worldwide popularity due to the recognized limitations of fossil fuels and safety concerns of nuclear fuels. The photovoltaic (PV) solar energy demand has grown at least 25% per annum over the past 15 years. Worldwide photovoltaic installations increased by 1460 MW (Megawatt) in 2005, up from 1,086 MW installed during the previous year (representing a 34% yearly increase) and compared to 21 MW in 1985.

Most growth in the field of solar energy has focused on solar modules fixed on top of an existing roof. Rooftops provide direct exposure of solar radiation to a solar cell and structural support for photovoltaic devices. Despite increased growth, the widespread use of conventional roof-mounted solar modules has been limited by their difficulty and cost of installation, lack of aesthetic appeal, and especially their low conversion efficiency.

Most conventional roof-mounted solar modules are constructed largely of glass enclosures designed to protect the fragile silicon solar cells. These modules are complex systems comprising separate mechanical and electrical interconnections that are then mounted into existing rooftops, requiring significant installation time and skill. Available modules are also invasive in the aesthetics of homes and commercial buildings, resulting in limited use. A few manufacturers have fabricated more aesthetically pleasing and less obstructive solutions, but the systems are not price competitive largely due to installation difficulties and poor total area efficiency. Lower module efficiency levels are correlated to higher photovoltaic system costs because a greater module area is required for a given energy demand.

The efficiency of converting light into electricity for a typical crystalline-silicon roof-mounted solar cell is approximately 13%. Some systems have seen efficiency increases (up to 18-20%) by modifications such as the use of anti-reflective glass on the cell surface to decrease optical reflection, use of textured glass on the cell surface to increase light trapping, and the use of improved materials like thin film silicon or germanium alloy. Despite these improvements, solar cell conversion efficiency remains limited, in part, by high solar cell temperatures. The efficiency of a photovoltaic device decreases as the temperature increases. Part of the energy radiated onto the cell is converted to heat, which limits the electrical energy output and overall conversion efficiency of the cell. Fabrication of a system capable of removing heat from the photovoltaic cell would greatly increase total efficiency.

There is significant interest in and need for a photovoltaic module that addresses the above problems.

BRIEF SUMMARY OF THE INVENTION

Described herein are various solar modules that produce energy from the sun's radiation as well as various methods employed in fabrication of those solar modules. Some of the modules have increased efficiency in converting solar energy to electricity. Some modules are aesthetically attractive and well suited for installation over top of conventional roofs.

In one instance, the photovoltaic module has photovoltaic cells, a frame retaining the photovoltaic cells and adapted to mount on a finished rooftop, and a heat sink to remove heat from the photovoltaic cells. The heat sink has fins positioned parallel along a heat sink base and parallel to each other. The heat sink base has a thickness of between 0.05" and 0.5", and the fins each have a height between 0.25" and 7", a center to center spacing between 0.05" and 1", and a width between 0.001" and 0.25", and the center to center spacing is sufficient to provide a channel between said fins for cooling air to enter. In another instance, the heat sink base has a thickness of between 0.1" and 0.25", and the fins each have a height between 0.75" and 5", a center to center spacing between 0.2" and 0.5", and a width between 0.007" and 0.1". In another instance, the heat sink base has a thickness of between 0.1" and 0.2", and the fins each have a height between 0.9" and 2", a center to center spacing between 0.3" and 0.4", and a width between 0.02" and 0.05".

In other instances, the photovoltaic module has a thermal interface layer between the heat sink and photovoltaic cells to improve heat dissipation. In other instances, the module has a conformal coating on the photovoltaic cells.

In other instances, the frame of the module does not extend beyond the base of the heat sink, allowing unimpeded access of ambient air to fins of the heat sink.

In other instances, the heat sink has a length, thickness, fin height, fin spacing and fin width to maintain the photovoltaic cell at a temperature below about 150° F. in quiescent ambient air at a temperature of 70° F.

In other instances, the heat sink has of fins positioned substantially parallel to a long axis of the heat sink. In other instances, the fins are positioned substantially perpendicular to a long axis of the heat sink.

In other instances, the heat sink is positioned substantially parallel to a long axis of the photovoltaic module. In other instances, the heat sink is positioned substantially perpendicular to a long axis of the module. In other instances, the heat sink has a length sufficient to span greater than ¾ the width of the module. In other instances, the heat sink has a length sufficient to span greater than ¾ the length of the module.

In other instances, the heat sink is constructed of extruded aluminum. In other instances, the heat sink is constructed of black anodized aluminum. In other instances, heat sink base is constructed of a thermally conductive polymer. In other instances, the heat sink base is constructed of elastomer.

In other instances, the fins are discontinuous along a long axis of the heat sink base to form air escape and entry channels. In other instances, the channels are herringbone shape.

The present invention is better understood upon consideration of the detailed description below in conjunction with the accompanying drawings and claims.

BRIEF DESCRIPTION OF THE DRAWINGS

FIG. 4A-1 is a cross-sectional view of an upper jig and a lower jig used to construct a photovoltaic module.

FIG. 4A-2 is a bottom view of an upper jig.

FIG. 4D illustrates the apparatus shown in FIG. 4C where the upper jig and lower jig are compressed.

DETAILED DESCRIPTION

The following description is presented to enable a person of ordinary skill in the art to make and use the invention. Descriptions of specific materials, techniques, and applications are provided only as examples. Various modifications to the examples described herein will be readily apparent to those of ordinary skill in the art, and the general principles defined herein may be applied to other examples and applications without departing from the spirit and scope of the invention. Thus, the present invention is not intended to be limited to the examples described and shown, but is to be accorded the scope consistent with the appended claims.

Figure 1:
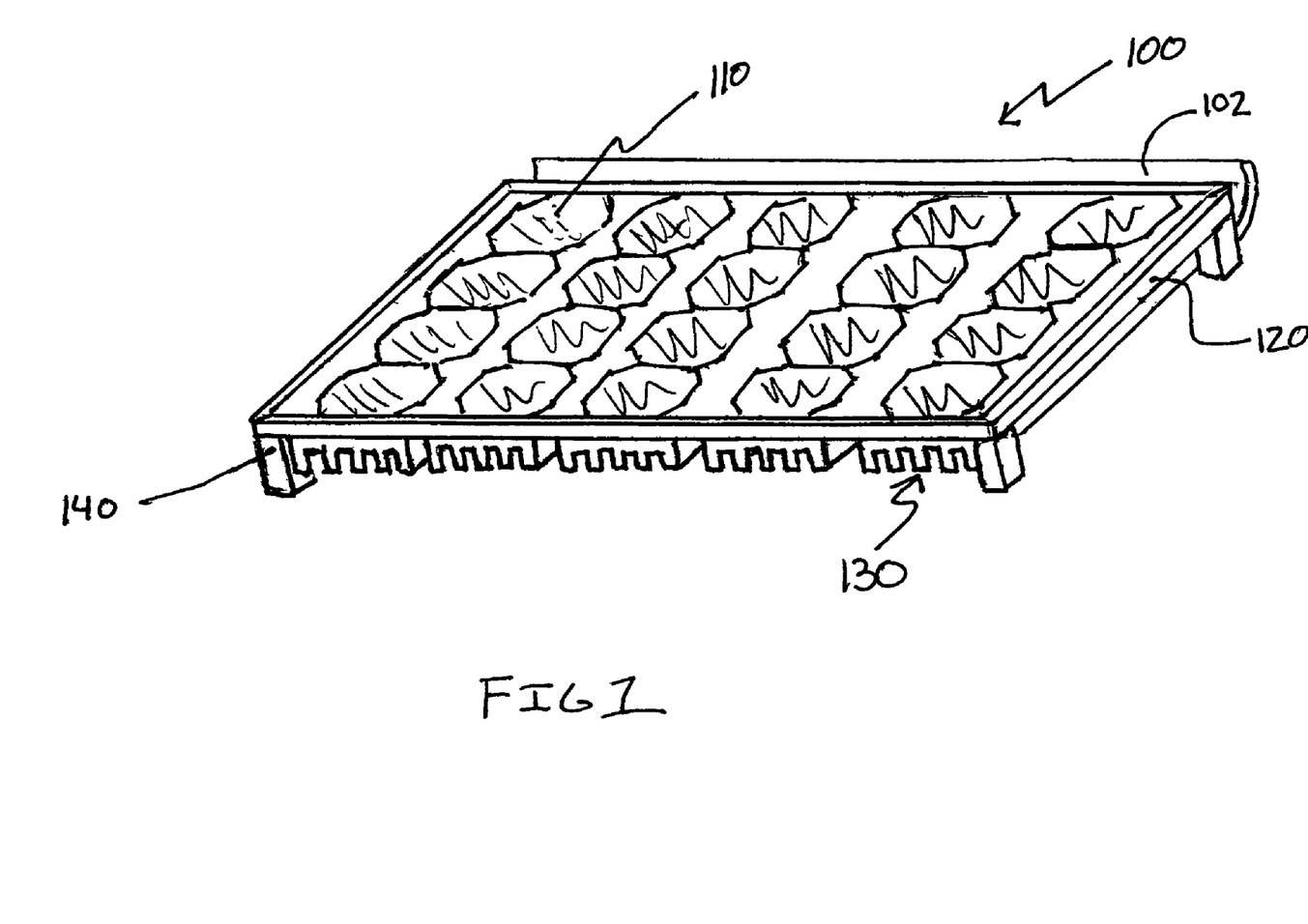
FIG. 1 is a perspective view of a photovoltaic module with heat sinks.
Figure 2:
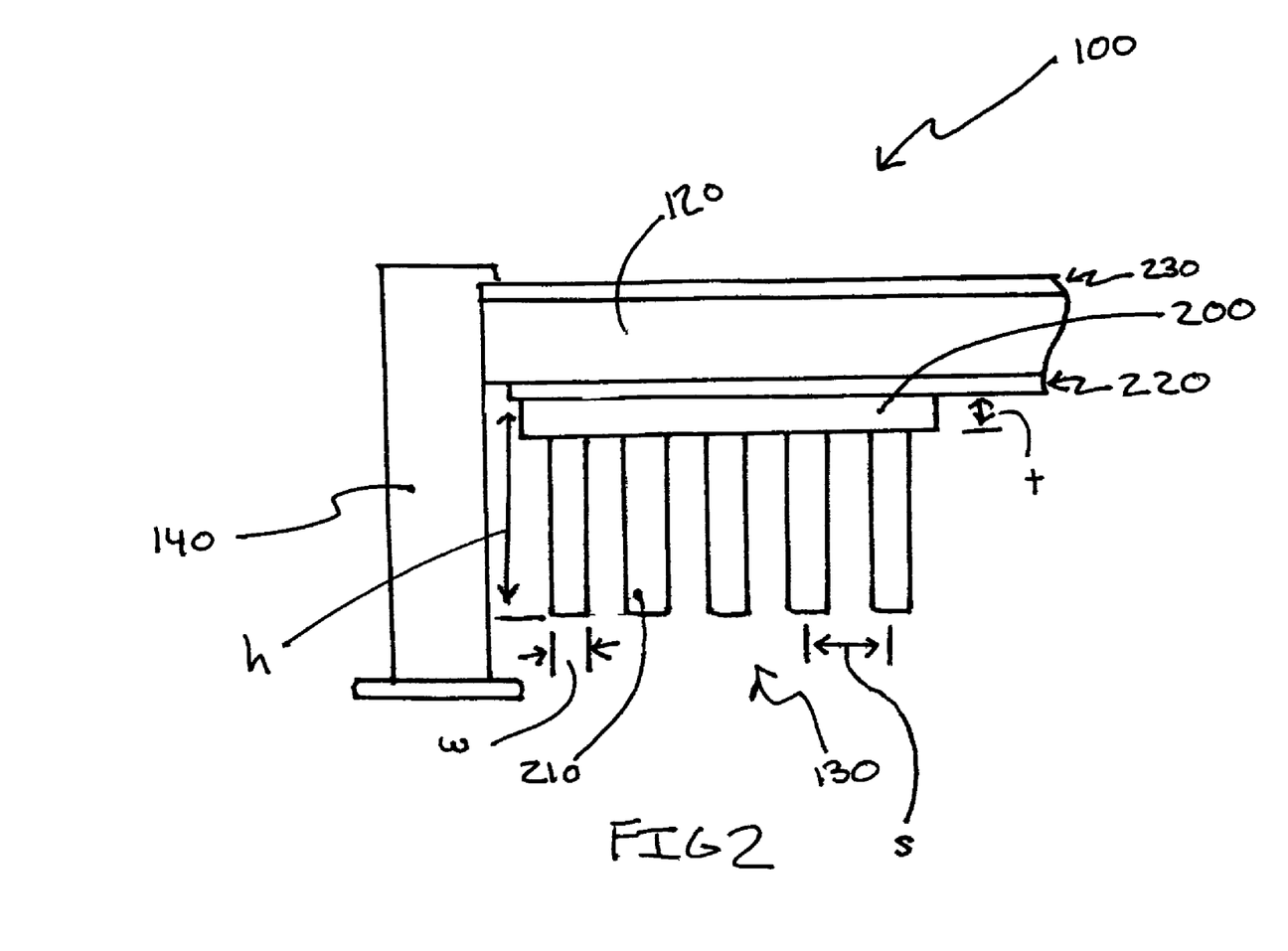
FIG. 2 is a partial side view of a FIG. 1.

FIGS. 1 and 2 illustrate an example of a photovoltaic (PV) module 100 of the present invention. The photovoltaic module 100 comprises a photovoltaic array of interconnected photovoltaic cells 110 positioned within a frame 120, which may be adapted to mount the module on a finished rooftop. Each photovoltaic cell is positioned within the frame 120 to allow exposure of a cell's light-receiving surface to solar radiation.

Each photovoltaic cell 110 may be any currently used in the art or developed in the future, such as a silicon-based wafer photovoltaic cell, a thin film photovoltaic cell, or a conductive polymer that converts photons to electricity. Such cells are well-known and include wafer-based cells formed on a monocrystalline silicon, poly- or multicrystalline silicon, or ribbon silicon substrate. A thin-film photovoltaic cell may comprise amorphous silicon, poly-crystalline silicon, nanocrystalline silicon, micro-crystalline silicon, cadmium telluride, copper indium selenide/sulfide (CIS), copper indium gallium selenide (CIGS), an organic semiconductor, or a light absorbing dye.

Each photovoltaic cell 110 may be of any shape (e.g. square, rectangular, hexagonal, octagonal, triangular, circular, or diamond) and located in or on a surface of a module. A photovoltaic cell in a module is one recessed within the module frame with essentially only the top surface of the cell exposed to the light source. A photovoltaic cell on a module is one placed directly on top of the frame with essentially only the bottom surface not exposed to the light source.

The electrical configurations between individual photovoltaic cells 110 as well as the electrical connections between individual modules may independently be configured as series, parallel, or mixed series-parallel as is well known in the art to achieve the desired operating current and voltage. For example, individual photovoltaic cells within a module are connected in series to increase the total operating voltage of the module. If the voltage produced by each individual photovoltaic cell within a module is sufficient, then the cells may be connected to adjacent cells in parallel to maintain voltage and increase current.

The photovoltaic module comprises one or more heat sinks 130 in thermal communication with the unexposed surface of the photovoltaic cells 110 to dissipate the waste heat from the cells. As illustrated in FIG. 2, each heat sink may comprise a base 200 attached to the flat surface of the unexposed surface of the solar cells and a plurality of fins 210 extending substantially perpendicular to a large surface of the base and substantially parallel to the long axis of each other. The base and fins may be constructed separately and later joined, or constructed as one unit from the same material source. The heat sink may be in direct physical contact with the solar cells or may have one or more intervening layers. An example of an intervening layer is an intervening thermal interface layer 220, which can be made of any material used in the art, such as thermally conductive grease or adhesive (e.g. conductive epoxy, silicone, or ceramic) or an intervening thermally conductive polymer, such as a thermally conductive polymer available from Cool Polymers, Inc. The intervening layer may be of any material commonly used in the art (e.g. ethyl-vinyl-acetate (EVA), polyester, Tedlar®, EPT). The thermal interface layer may be constructed of material that is both electrically isolative and thermally conductive. The thermal interface layer may be a thin layer of polymer that is not intrinsically thermally conductive but, due to its thinness, conducts heat at a sufficient rate that it is considered thermally conductive. Other layers may be present separately or in addition to an intervening thermal interface layer, such as one or more electrically insulating layers. The intervening layer may be in simultaneous contact with both the solar cell(s) and the heat sink.

The heat sinks may be positioned substantially parallel or substantially perpendicular to the long axis of the module 100 and may span portions of or the entire length or width of the module. Likewise, multiple heat sinks may be aligned in tandem, with or without intervening space, to span the portions of or the entire length or width of the module, if desired. In one variation a heat sink has sufficient length to span greater than ¾ of the length of the module. In another variation a heat sink has sufficient length to span greater than ¾ of the width of the module. In some variations different heat sinks on the module will be positioned substantially perpendicular to one another.

The base 200 and fins 210 of each heat sink can be independently constructed of one or more thermally conductive materials, such as aluminum or aluminum alloy (e.g. 6063 aluminum alloy, 6061 aluminum alloy, and 6005 aluminum alloy), copper, graphite, or conductive polymer (such as conductive elastomer as available from, e.g. Cool Polymers, Inc.), and may be of any color, such as blue, black, gray, or brown. Dark colors may improve heat sink performance. A heat sink constructed of metal may be anodized or plated. Heat sinks may be constructed by common manufacturing techniques such as extrusion, casting, or injection molding, or may be constructed using a combination of manufacturing techniques to construct hybrid heat sinks (e.g. aluminum fins molded into a conductive polymer base).

FIG. 2 illustrates dimensions of a heat sink 130. A base 200 may have a thickness designated as t. Fins 210 may independently have a height designated h, a center to center spacing designated as s, and a width designated as w. The width w of any fin may be independently less than 1 inch, or less than 0.75", or less than 0.5", or less than 0.3", or less than 0.2", or less than 0.15", or less than 0.1", or less than 0.05", or less than 0.025", or less than 0.01", or less than 0.005", or less than 0.0025", or less than 0.001", or between 0.001" and 0.25", or between 0.002" and 0.1", or between 0.005" and 0.075", or between 0.01" and 0.06", or between 0.02" and 0.05", or 0.02". The height h of any fin may be independently greater than 0.1", or greater than 0.25", or greater than 0.5", or greater than 0.75", or greater than 1", or greater than 2", or greater than 3.5", or between 0.25" and 7", or between 0.5" and 6", or between 0.75" and 5", or between 0.8" and 2.5", or between 0.9" and 2", or between 0.9" and 1.25", or 1". The center to center spacing s between fins may be independently between 0.05" and 1", or between 0.075" and 0.9", or between 0.1" and 0.8", or between 0.2" and 0.7", or between 0.2" and 0.5", or between 0.25" and 0.45", or between 0.25" and 0.4" or between 0.3" and 0.4", or between 0.3" and 0.45", or between 0.35" and 0.4". The thickness t of the base of each heat sink may be independently less than 1", or less than 0.75", or less than 0.5", or less than 0.4", or less than 0.3", or less than 0.2", or less than 0.15", or less than 0.1", or less than 0.05", or between 0.05" and 0.5", or between 0.075" and 0.35", or between 0.1" and 0.25", or between 0.1" and 0.2", or 0.1", or 0.15", or 0.2". The ratio of center to center spacing (s) to the fin height (h) (i.e. s/h) may be independently 0.1, 0.15, 0.2, 0.25, 0.3, 0.35, 0.4, 0.45, 0.5, 0.5, 0.6, 0.65, 0.7, or between 0.1 and 0.7, or between 0.15 and 0.5, or between 0.2 and 0.4, or between 0.2 and 0.35, or between 0.25 and 0.3. The dimensions of any fin may be identical or different from the dimensions of any other fin on the same heat sink. The dimensions of any fin or base may be identical or different from the dimensions of any other fin on another heat sinks. The dimensions of all heat sink bases on a module may be the same. The dimensions of all heat sink fins of all heat sinks on a module may be the same. The dimensions of all heat sink fins of an individual heat sink may be the same. The height of all fins of a heat sink may be the same. The height of all fins of a heat sink may be different. The average height of all fins of a heat sink may be of any dimension described above. The average center to center spacing of all fins of a heat sink may be of any dimension described above. The average width of all fins of a heat sink may be of any dimension described above.

The dimensions of each heat sink may independently be any combination of the dimensions described above, such as w between 0.002" and 0.1", h between 0.75" and 5", s between 0.2" and 0.5", and t between 0.1" and 0.25"; w between 0.001" and 0.25", h between 0.75" and 5", s between 0.2" and 0.5", and t between 0.1" and 0.25"; w between 0.02" and 0.05", h between 0.75" and 5", s between 0.2" and 0.5", and t between 0.1" and 0.25"; w between 0.002" and 0.1", h between 0.25" and 7", s between 0.2" and 0.5", and t between 0.1" and 0.25"; w between 0.002" and 0.1", h between 0.9" and 2", s between 0.2" and 0.5", and t between 0.1" and 0.25"; w between 0.002" and 0.1", h between 0.75" and 5", s between 0.05" and 1", and t between 0.1" and 0.25"; w between 0.002" and 0.1", h between 0.75" and 5", s between 0.3" and 0.4", and t between 0.1" and 0.25"; w between 0.002" and 0.1", h between 0.75" and 5", s between 0.2" and 0.5", and t between 0.05" and 0.5"; and w between 0.002" and 0.1", h between 0.75" and 5", s between 0.2" and 0.5", and t between 0.1" and 0.2".

A long axis of fins 210 may be substantially parallel or substantially perpendicular to a long axis of the base. Substantially parallel is when two referenced axes form an angle of less than 10°. Substantially perpendicular is when two referenced axes form an angle between 85° and 95°. A long axis is an axis parallel to the longest straight edge of the object referenced. A long axis is implied if no axis is referenced. The fins may run continuously along most or all of the length of the base. Fins may form different angles with respect an axis of the heat sink (e.g. a fan orientation), so that air may pass freely through many of the channels formed by adjacent fins regardless of wind direction. Surfaces of fins may also have features such as ridges or bumps that help induce eddies in air flowing past the fins to help convection.

A heat sink may be designed such that a first volume (defined as a volume of a heat sink including its associated heat sink base) is a percentage of a second volume (defined as a volume from a top-down projected surface area of the heat sink base and a third dimension, wherein the third dimension is defined by the least squares determination from the heights of each protrusion on the heat sink base (such as cones, fins, etc.)). For example, if all protrusions of a heat sink are of equal dimensions then the first volume would be the heat sink base volume added to the product of the volume of each protrusion and the number of protrusions; and the second volume would be the top-down projected surface area of the heat sink base (e.g. width×length, if the heat sink base were rectangular) multiplied by the protrusion height (i.e. the third dimension). If the heights of protrusions within a heat sink are different, then the least squares determination of all protrusion heights would determine the third dimension used in the example above. The percent volume is the first volume divided by the second volume×100. The percent volume may be, for example, between 10% and 50%, between 15% and 45%, between 20% and 40%, between 25% and 35%, between 20% and 30%, between 25% and 30%, between 30% and 35%, between 35% and 40%, between 40% and 45%, between 45% and 50%, between 20% and 25%, between 15% and 20%, between 10% and 15%, between 10% and 20%, between 15% and 25%, between 25% and 35%, between 30% and 40%, between 35% and 45%, between 40% and 50%, between 10% and 25%, between 15% and 30%, between 20% and 35%, between 25% and 40%, between 30% and 45%, between 35% and 50%, between 10% and 12.5%, between 12.5% and 15%, between 15% and 17.5%, between 17.5% and 20%, between 20% and 22.5%, between 22.5% and 25%, between 25% and 27.5%, between 27.5% and 30%, between 30% and 32.5%, between 32.5% and 35%, between 35% and 37.5%, between 37.5% and 40%, between 40% and 42.5%, between 42.5% and 45%, between 45% and 47.5%, or between 47.5% and 50%.

Figure 3:
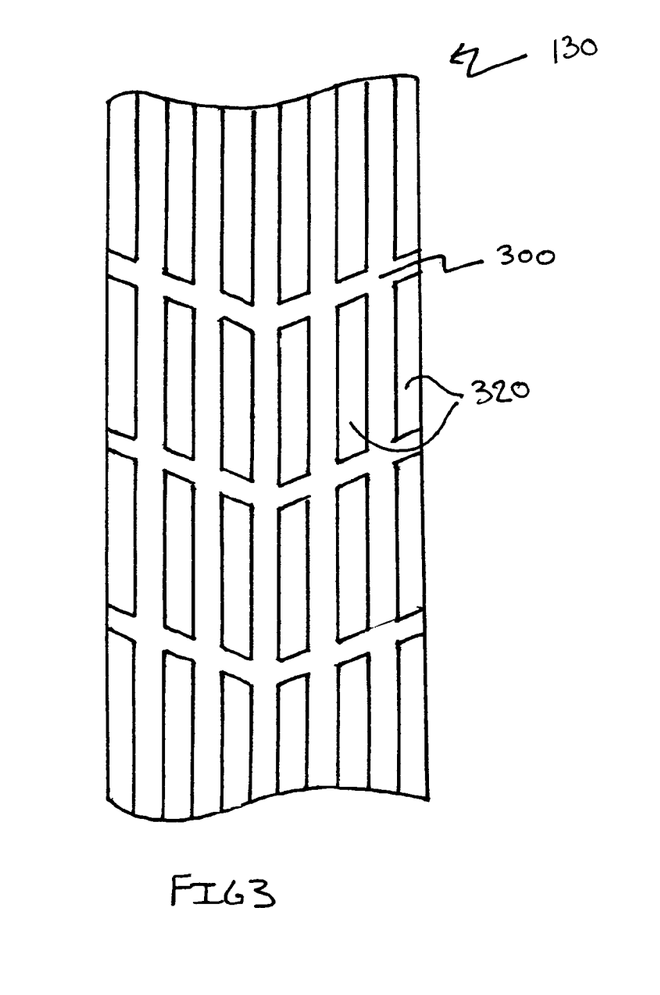
FIG. 3 is a bottom view of a heat sink.

FIG. 3 is a top-down view of a heat sink 130 with optionally present channels 300 formed by segmented heat sink fins 320. Each channel provides an additional opening to the interior of the heat sink and allows increased airflow to the internal fins. Channels may be of any pattern, such as general cross-cut, herringbone, or undulating. The fins may also be replaced with other heat dissipating shapes attached to the base, such as pyramids (including frustum pyramids), cylinders, square pegs, or cones (including frustum cones).

The heat sink may be configured to reduce the temperature of a photovoltaic cell in ambient quiescent air that is at standard temperature and pressure and an irradiance (E) by white light individually or in any combination of 800 W*m$^{-2}$, 1000 W*m$^{-2}$, or 1200 W*m$^{-2}$ by at least 1° C.; or by at least 2° C.; or by at least 5° C.; or by at least 7° C.; or by at least 10° C.; or by at least 12° C.; or by at least 15° C.; or by at least 20° C. as compared to an identical cell lacking the heat sink. The size, number, and spacing of fins, the size of the base portion, and the materials of construction of the heat sink may be selected based on the desired decrease in temperature over the comparative PV cell.

The heat sink may be configured to maintain a photovoltaic cell at a temperature below about 175° F., or below about 160° F., or below about 150° F., or below about 140° F., or below about 130° F., or below about 120° F., or below about 110° F., or below about 100° F., or below about 90° F., or below about 80° F. in quiescent ambient air at a temperature of 70° F. at standard pressure.

The heat sink may be configured to increase the energy conversion efficiency (defined by the equation: $\eta = (P_m/(E \times A_c))$, where $P_m$ is maximum electrical power in watts, E is the input light irradiance in W*m$^{-2}$ and $A_c$ is the surface area of the solar cell in m$^2$) or total-area efficiency of a photovoltaic cell (which may be defined by the relative change in current (I) and/or voltage (V) or relative change in the product of I and V) in ambient quiescent air that is at standard temperature and pressure and an irradiance (E) by white light individually or in any combination of 800 W*m$^{-2}$, 1000 W*m$^{-2}$, or 1200 W*m$^{-2}$ by at least 0.5%; or by at least 1%; or by at least 1.5%; or by at least 2%; or by at least 2.5%; or by at least 3%; or by at least 3.5%; or by at least 4%; or by at least 4.5%; or by at least 5%; or by at least 5.5%; or by at least 6%; or by at least 6.5%; or by at least 7%; or by at least 7.5%; or by at least 8%; or by at least 8.5%; or by at least 9%; or by at least 9.5%; or by at least 10% as compared to an identical cell lacking the heat sink.

If desired, the heat sink may be subjected to forced airflow provided by any means, e.g. one or more fans, to increase airflow over the heat sink and increase cooling effectiveness of the photovoltaic cell. A fan may deliver the forced air to the heat sink by direct exposure or remotely through a duct system.

The module may contain a protective layer 230 as shown in FIG. 2 adjacent to the light-receiving surface of each photovoltaic cell to protect the photovoltaic cells from damage (caused, for example, from moisture, dust, chemicals, and temperatures changes), while allowing the transmission of sunlight. The protective layer may conform to the surface shape of the photovoltaic cells and may be made of any suitable material, such as glass (e.g. low-lead tempered glass) or polymer (e.g. parylene or ethyl-vinyl-acetate). The protective layer may be a film (clear or colored) and be made of e.g. acrylics, epoxies, urethanes, and silicones. The protective layer may optionally be an antireflective coating, such as silicon nitride.

As shown in FIGS. 1 and 2, a photovoltaic module may have a frame 120 with mounting fixtures such as screw holes, tabs, and/or electrical connections that are suitable to mount the module in framework that is attached to a finished rooftop so that heat from the solar cells may be dissipated into ambient air. The frame may surround the photovoltaic cells and, optionally, may surround additional layers that may be present adjacent to cells. It is preferable for roof-top mounting that little or none of the frame of the module blocks access to the heat sinks 130 so that relatively cool air may flow freely through the cooling fins. In one experiment, blocking access to the heat sink via a frame resulted in decreased photovoltaic efficiency. FIGS. 1 and 2 illustrate how the fins and channels there between are free of the frame so that air may travel through the channels unimpeded by the frame (e.g. allowing horizontal access to the heat sink).

The frame may comprise a flange or lip 102 (straight or curved) as shown in FIG. 1 oriented to direct air flowing through the heat sink upward upon exiting the module. This feature may prevent hot air generated from a heat sink from entering an adjacent module. Likewise, a flange or lip may be oriented to force fresh cold air flowing above a module or adjacent module into a heat sink. A feature of this orientation may be particularly useful to permit cool air to enter the underside of a module when multiple modules are arranged with minimal intervening space. Multiple flanges and/or lips may be incorporated into a single frame to direct cool air into a heat sink and to direct hot air away from a heat sink.

Optionally, legs 140 may be provided to permit the module to be set upon a flat surface during handling and prior to installation, thus supporting the weight of the module 100 and preventing compression of the fins. Legs 140 may also be used to mount the module to a surface such as a rooftop. Legs may be sufficiently long that they elevate the module a sufficient distance from the surface to which they are mounted that air flows freely beneath and through channels through and past the fins to provide improved energy conversion efficiency over a similar construction in which the fins touch the surface of the roof top.

The frame 120 and legs 140 may be independently constructed of one or more materials capable of supporting the photovoltaic module, such as metal (e.g. aluminum), ceramic, cement, composite, or polymer (e.g. conductive polymer). The frame and heat sink may be constructed as one mold from a conductive polymer, if desired. The frame may have an extended configuration to cover the heat sink wherein the frame may also include a screen or perforations along the sides to allow air flow to the heat sinks.

The framework into which modules may be inserted typically has footers especially adapted to mount to common roofing materials such as composite roofing or wood battens forming part of the roof structure. Often, the framework has a height such that fins of the module's heat sink just touch or are just above the surface (e.g. rooftop) on which the framework is mounted. Alternatively, the framework may elevate the module over the rooftop a sufficient distance that air may flow sufficiently freely beneath and through the channels between fins to provide improved efficiency over a similar construction in which the fins touch the rooftop.

A photovoltaic module may be formed in standard lengths of approximately e.g. 3 feet, 4 feet, 5 feet, 6 feet, 7 feet, 8 feet, 9 feet, 10 feet, or 1 meter, 1.5 meter, 2 meter, 2.5 meter, 3 meter, 3.5 meter, or 4 meter. The photovoltaic module may be formed in standard widths of approximately e.g. 1 foot, 1.5 feet, 2 feet, 2.5 feet, 3 feet, 3.5 feet, 4 feet, 4.5 feet, 5 feet, or 0.25 meter, 0.5 meter, 0.75 meter, 1 meter, 1.25 meter, 1.5 meter, 1.75 meter, or 2 meter.

Photovoltaic modules typically contain 3, 6, 9, 12, 15, 18, 21, 24, 27, 30, 20, 24, 28, 32, 36, 40, 25, 36, 45, 50, 42, 48, 54, 60, or 72 PV cells arranged in rows and columns. PV cells may be arranged, for instance, 4×9, 6×8, 6×9, 6×12, or 8×12. A module may, for example, have from five to ten heat sinks in instances where a single heat sink is in contact with cells across an entire row of PV cells in the module.

A typical photovoltaic module may have an overall width of between 35" and 40", an overall length of between 50" and 60", photovoltaic cells in a 6×9 configuration, and 9 heat sinks each spanning a column of photovoltaic cells across the width of the module. When viewing the solar-cell side of the module in which light receiving surfaces of the cells are visible ("top-down") the width of a module is the minor axis or the shortest distance between opposite walls of the frame. Columns span the module width, while rows span the module length. In another configuration, a photovoltaic module may have an overall width of between 35" and 40", an overall length of between 45" and 55", photovoltaic cells in a 6×8 configuration, and 8 heat sinks each spanning a column of photovoltaic cells across the width of the module. In another configuration, a photovoltaic module may have an overall width of between 20" and 30", an overall length of between 50" and 60", photovoltaic cells in a 4×9 configuration, and 8 heat sinks each spanning a column of photovoltaic cells across the width of the module. In another configuration, a photovoltaic module may have an overall width of between 30" and 40", an overall length of between 50" and 55", photovoltaic cells in an 8×12 configuration, and 12 heat sinks each spanning a column of photovoltaic cells across the width of the module. Other module configurations described within (such as heat sinks spanning the length of the module) may be applied to the examples above.

In one example, a module was constructed containing 36 photovoltaic cells in a 4×9 configuration of Noncrystalline silicon (225 μm thickness). The cells were laminated with glass using an SPI-laminator (Spire, Inc.) and heat sinks attached using Omegabond® 101 epoxy cement. Heat sinks contained fins with the following dimensions: w=0.06", h=0.9375", s=0.3", and t=0.1". Each heat sink contained eight fins and had an overall width of 2.5". Two heat sinks were abutted such that the overall width of the joined heat sinks was 5" in order to cover the width of each photovoltaic cell.

Often anywhere from 4 to 20 modules are installed in a solar module on the roof-top of a house, depending on the amount of south-facing (in the northern hemisphere) rooftop that is available. Many more solar modules may be installed on the larger roofs of commercial buildings, for instance.

The photovoltaic modules described herein may be linked together by any method and/or using any apparatus known in the art. Photovoltaic modules may also be designed to interlock mechanically and/or electronically, as described in U.S. Provisional Application No. 60/874,313, entitled "Modular Solar Roof Tiles And Solar Panels With Heat Exchange" filed Dec. 11, 2006, which is incorporated by reference in its entirety. Modules may also be separated from one another with sufficient space to allow increased airflow between the modules to improve cooling of photovoltaic cells.

Another feature of the present invention is a method of manufacturing a photovoltaic module. FIGS. 4A-4E are different views during the described fabrication process of a photovoltaic module.

Figure 4A:
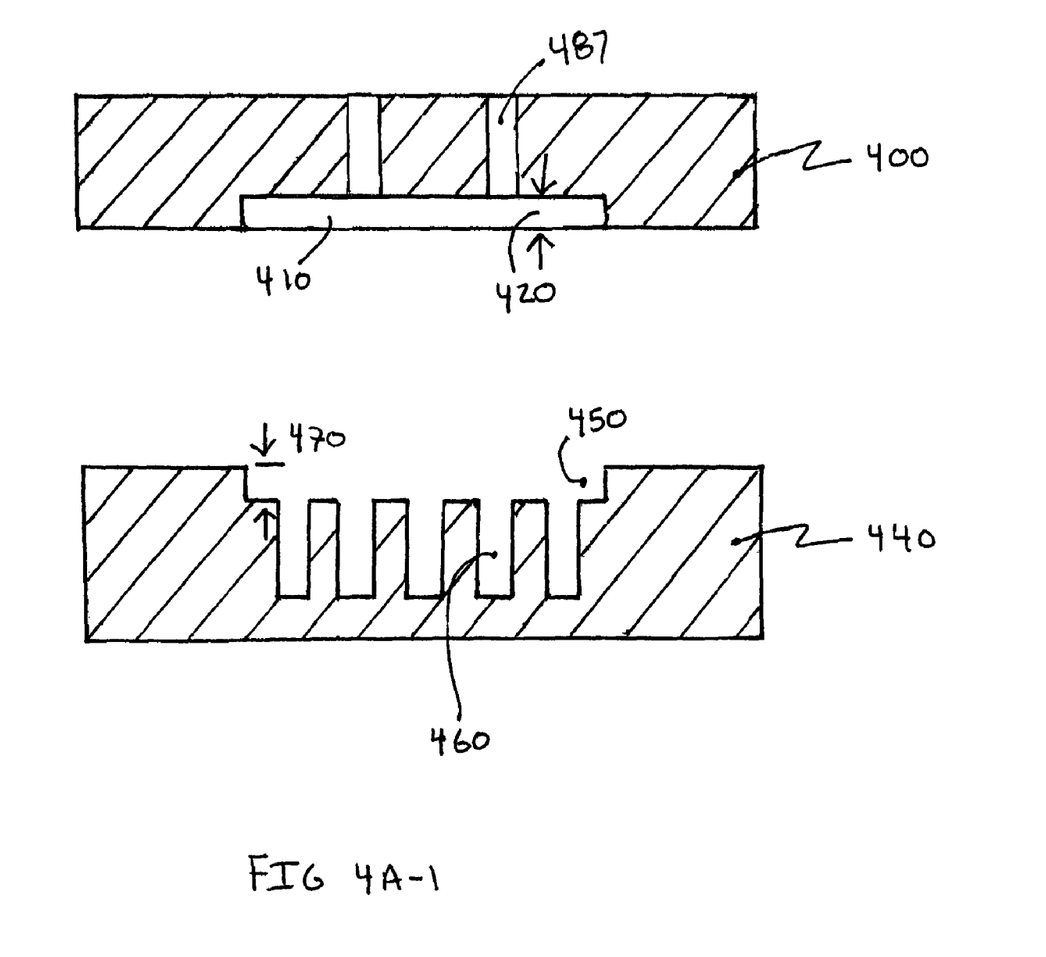
Figure 4A:
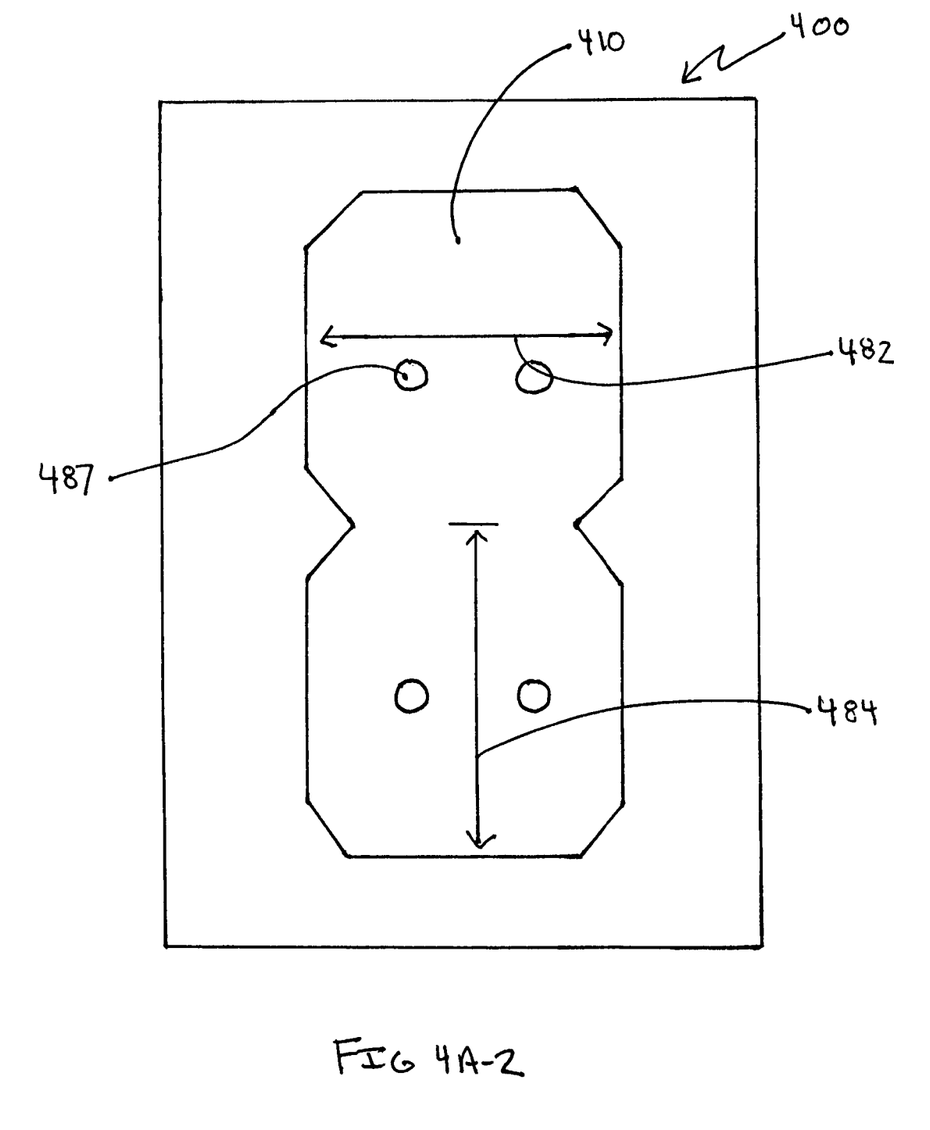

FIG. 4A-1 illustrates a cross-sectional view of a system used to construct a photovoltaic module. An upper jig 400 comprises an optionally present depression 410 designed to complement one or more photovoltaic cells. The depression may have a depth 420 roughly the thickness of the photovoltaic cell(s), or less than the thickness of the cell or cells. Vacuum channels 487 in any shape, number, and configuration may be present to allow a vacuum source through the upper jig to the photovoltaic cell(s). A vacuum source may allow the photovoltaic cells(s) to be temporarily held within the depression 410 during the manufacturing process. FIG. 4A-2 shows the upper jig 400 from a bottom view. Each depression 410 is shown with its corresponding width 482 and length 484. The width and length can independently have roughly the same dimensions as the largest surface of the cell or cells, or have slightly larger dimensions. The number of depressions 410 may be united or separated and any number desired for the module, such as 1, 2, 3, 4, 5, 6, 7, 8, 9, 10, 11, 12, 13, 14, 15, 16, 17, 18, 19, 20, or 25. The shape of a depression may be of any shape of photovoltaic cell or cells, such as square, rectangular, hexagonal, octagonal, triangular, circular, or diamond.

A lower jig 440 shown in FIG. 4A-1 may comprise a base depression 450 and fin depressions 460. The base depression 450 and fin depressions 460 may be designed to collectively compliment a heat sink such that the heat sink may be inserted into the lower jig and is incapable of substantial horizontal movement following insertion. The base depression may have a depth 470 roughly the thickness of a heat sink base or slightly less than the thickness of a heat sink base, and a width roughly the same as the heat sink base or slightly larger than the heat sink base. The base depression may be optionally present. Each fin depression 460 may have roughly the same dimensions as the heat sink fins or slightly larger dimensions to allow uninhibited insertion of the heat sink. The lower jig 440 may also be designed to complement any number of heat sink designs describe herein, such as pyramids (including frustum pyramids), cylinders, square pegs, or cones (including frustum cones). Vacuum channels (not shown) may be present to provide a vacuum source through the lower jig to the heat sink, as described for the upper jig.

The material of the upper and lower jig may be independently any material known in the art, such as aluminum, copper, ceramic, and polymer. The upper jig and the lower jig may be in reverse orientation, such that the upper jig is below the lower jig.

Figure 4B:
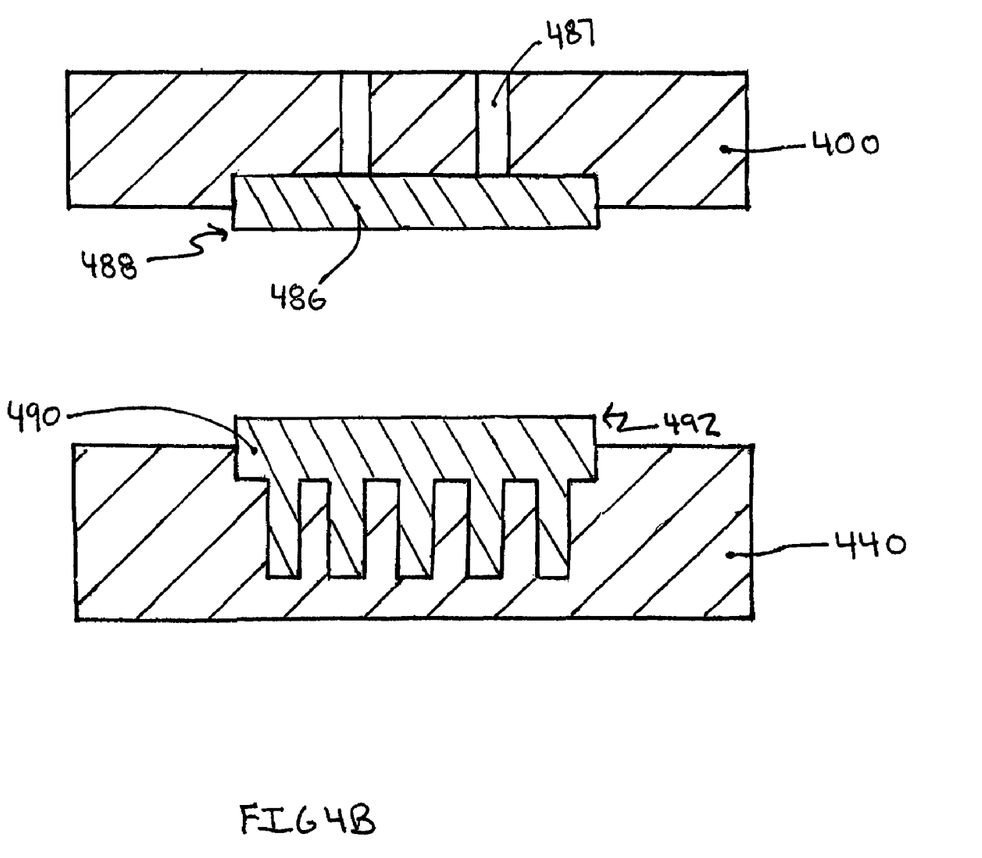
FIG. 4B is the view shown in FIG. 4A-1 with a photovoltaic cell and a heat sink.

The photovoltaic module manufacturing process may begin by placing the photovoltaic cell(s) and the heat sink into their respective jigs, as illustrated in FIG. 4B. The upper jig 400 houses one or more photovoltaic cells 486 inserted into each depression 410 such that a flat surface of each cell 488 is exposed while most of the remaining surface area of each cell is housed within depression. Each cell may be made of any material described herein or known in the art, such as wafer-based cells formed on a monocrystalline silicon, poly- or multicrystalline silicon, or ribbon silicon substrate, and may be of any shape, such as square, rectangular, hexagonal, octagonal, triangular, circular, or diamond. The cell(s) may be temporarily fixed to the upper jig 400 by gravity, vacuum (using e.g. optionally present vacuum channels 478), or any common adherent. The lower jig 440 houses the heat sink 490 such that a flat surface of the heat sink 492 is exposed while most of the remaining surface area, such as the fins, is housed within depression. The heat sink may be made of any thermally conductive material known in the art and/or described herein, such as aluminum or aluminum alloy (e.g. 6063 aluminum alloy, 6061 aluminum alloy, and 6005 aluminum alloy), copper, graphite, or conductive polymer (such as conductive elastomer), may be of any color (e.g. blue, black, gray, or brown) and may comprise cooling surfaces configured of any geometry, such as pyramids (including frustum pyramids), cylinders, square pegs, or cones (including frustum cones). The heat sink may be temporarily fixed to the lower jig 440 by gravity, vacuum, or any common adherent.

Figure 4C:
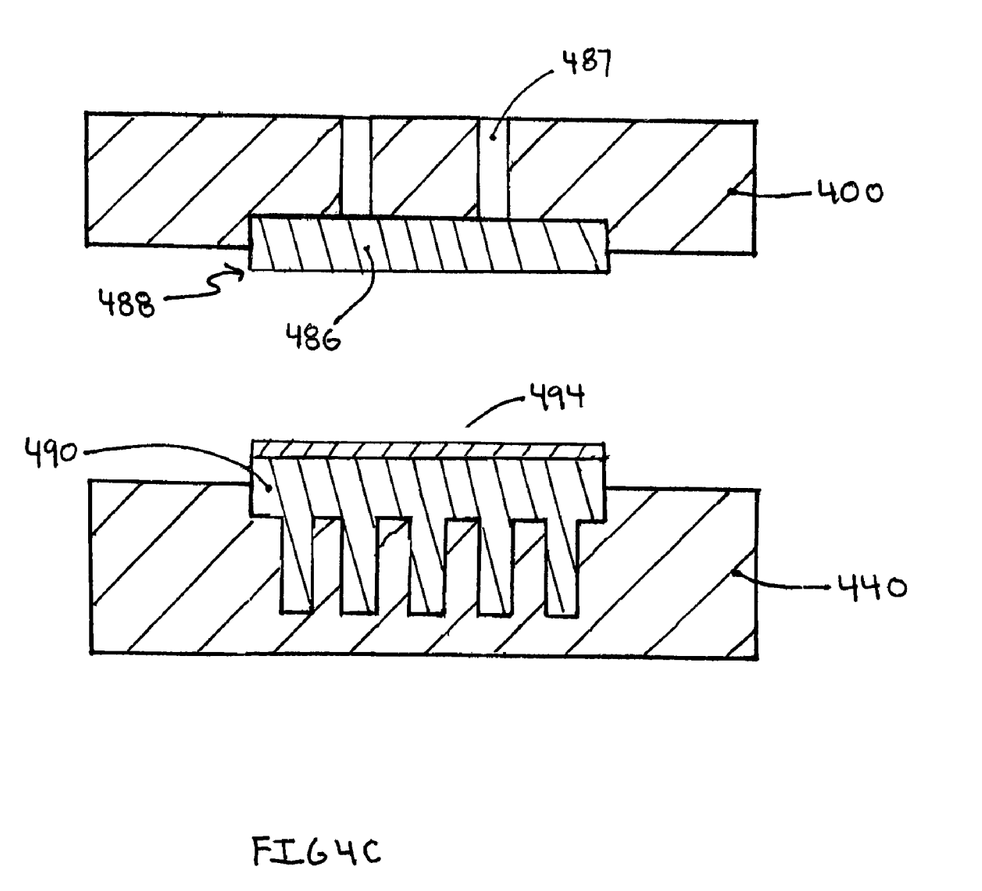
FIG. 4C is the view shown in FIG. 4B with an interface layer.

FIG. 4C illustrates how an intervening layer 494 may be added to the exposed surface of the heat sink 492 or to the exposed surface(s) of the cell(s). The intervening layer may be a thermal interface layer, such as thermally conductive grease (e.g. conductive epoxy, silicone, or ceramic) or an intervening polymer such as a thermally conductive polymer. The intervening layer may be of any material commonly used in the art (e.g. ethyl-vinyl-acetate (EVA), polyester, Tedlar®, EPT). The thermal interface layer may be, for example, constructed of any material that is both electrically isolative and thermally conductive and may be a compound or mixture of compounds that chemically react when exposed to air, heat, and/or pressure. The intervening layer may comprise multiple layers, such as an electrically isolating layer next to PV cells and a thermally conductive layer next to a heat sink, or may be absent. The layer may be in simultaneous contact with both the photovoltaic cell(s) and the heat sink.

As illustrated in FIG. 4D, both jigs house the heat sink 490, optionally present intervening layer 494, and photovoltaic cell(s) 486 are sandwiched together to allow simultaneous contact of the optionally present intervening layer 494 with the heat sink and the photovoltaic cell(s). Sufficient pressure may be applied to either the upper jig 400, lower jig 440, or both, in a direction toward the photovoltaic components to allow pressure between the cell(s) and the heat sink, and force intimate contact of their surfaces. Because the upper jig is complementary to the housed cell(s) 486, the resulting applied pressure is distributed across the area of a cell-upper jig interface, thus preventing the likelihood of damage to the cell(s). Likewise, because the lower jig is complementary to the housed heat sink, the applied pressure may be less likely to damage the heat sink fins (e.g. crushing or warping the fins). Sufficient heat may also be applied during the process, separately or in conjunction with sufficient pressure, to intimately join the heat sink to the photovoltaic cell(s). This process of temporarily applying pressure and/or heat to unite two or more materials together, also known as laminating, may allow the surface(s) of the cell(s) to more closely contact an adjacent material at a microscopic level and allow increased conductive heat transfer away from the cell(s). A vacuum may be applied to decrease air pressure before, during, and/or after applying pressure and/or heat to aid in removing pockets of air between layers. Removing trapped air may allow a more intimate contact between layers resulting in increased thermal transfer.

Conditions during lamination may vary depending on the photovoltaic module configuration. In one instance the lamination temperature is approximately 155° C., decreased air pressure is applied for five minutes, and one atmosphere of pressure is applied by the jigs to force the heat sink and photovoltaic cell(s) between the jigs together for seven minutes. In another instance, the lamination temperature is between 100° C. and 200° C., or between 125° C. and 175° C., or between 135° C. and 155° C. In another instance 1.25, 1.5, 2, 2.5, 3, 3.5, 4, 4.5, or greater than 5 atmospheres of pressure is applied by the jigs to force the heat sink and photovoltaic cell(s) between the jigs together. In another instance, pressure is applied by the jigs for 1 to 30 minutes, 2 to 20 minutes, 5 to 15 minutes, or greater than 30 minutes. In another instance decreased air pressure is applied for 1 to 30 minutes, 2 to 20 minutes, 5 to 15 minutes, or greater than 30 minutes.

Figure 4E:
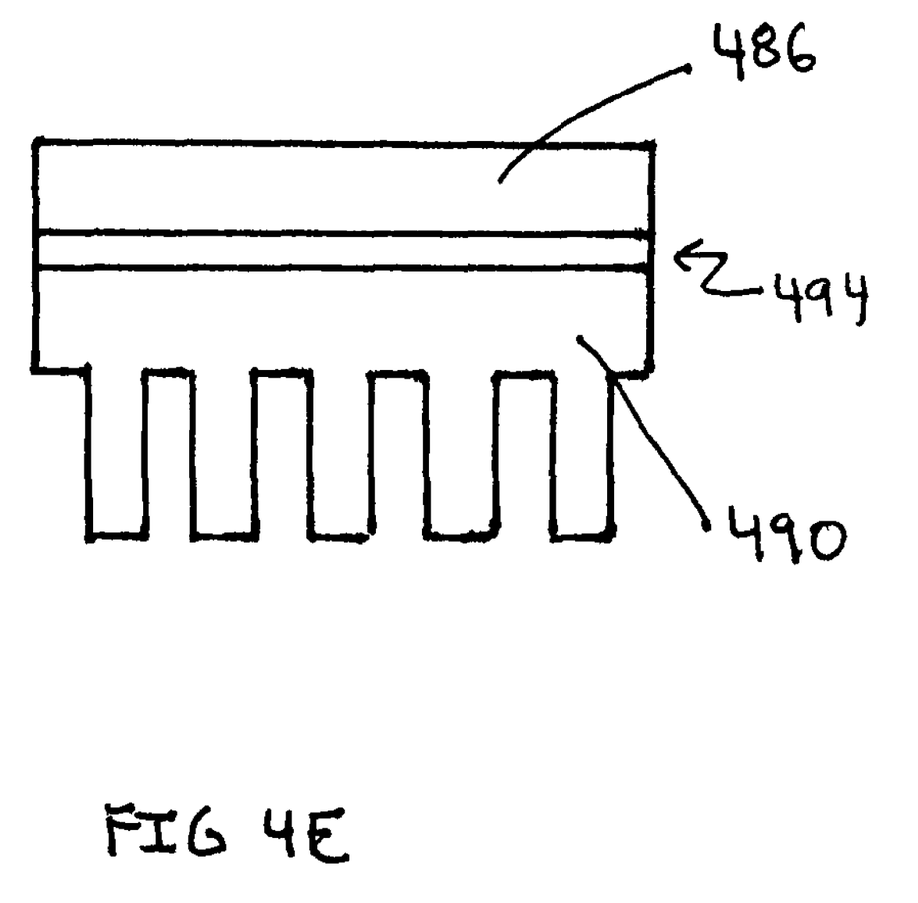
FIG. 4E shows a side view of a photovoltaic module produced by the described process.

FIG. 4E illustrates a photovoltaic module following removal of the upper jig and the lower jig.

The process may comprise additional layers known in the art (e.g. ethyl-vinyl-acetate (EVA), polyester, Tedlar®, EPT) on or within the module, such as a protective layer (e.g. conformal coating), as described herein.

The process may further comprise the addition of a frame, with or without legs, as described herein, to permit airflow through direct horizontal access to the heat sinks.

What is claimed is:

1. A photovoltaic module comprising:
   a. a plurality of photovoltaic cells;
   b. a frame retaining the plurality of photovoltaic cells and exposing light-receiving surfaces of the plurality of photovoltaic cells along a first surface of the frame; and
   c. a heat sink in thermal communication with an unexposed surface of said plurality of photovoltaic cells, said heat sink comprising:
      i) a base positioned substantially parallel to said unexposed surface; and
      ii) a plurality of protrusions attached to the base;
   wherein said frame comprises a flange extending through a plane containing said first surface of said frame, and oriented to channel a volume of air through said plane, said volume of air flowing through said plurality of protrusions;
   wherein said photovoltaic module is non-concentrating;
   wherein the protrusions are discontinuous in a first lateral axis parallel to the base and define a first air flow channel pattern and
   wherein the protrusions are discontinuous in a second lateral axis parallel to the base and define a second air flow channel pattern different from the first air flow channel pattern.

2. The photovoltaic module of claim 1, further comprising a thermal interface layer between the heat sink and said unexposed surface to improve heat dissipation.

3. The photovoltaic module of claim 1, further comprising a conformal coating on said light-receiving surfaces substantially transparent to visible light.

4. The photovoltaic module of claim 1, wherein said frame is configured to allow unimpeded access of ambient air to said plurality of protrusions.

5. The photovoltaic module from claim 1, wherein said protrusions are fins.

6. The photovoltaic module of claim 5, wherein said fins are discontinuous along a long axis of said base to form air escape and entry channels.

7. The photovoltaic module of claim 6, wherein said air escape and entry channels are herringbone shape.

8. The photovoltaic module from claim 5, wherein:
   said base has a thickness between 0.05" and 0.5"; and
   said fins each independently have a height between 0.25" and 7", a center to center spacing between 0.05" and 1", and a width between 0.001" and 0.25".

9. The photovoltaic module of claim 4, further comprising legs for mounting the photovoltaic module.

10. The photovoltaic module of claim 9, wherein the legs extend below the frame to impede access of ambient air to the plurality of protrusions.

* * * * *